United States Patent [19]
Li et al.

[11] Patent Number: 6,055,107
[45] Date of Patent: Apr. 25, 2000

[54] DIFFRACTIVE LENS AND PREPARATION METHOD THEREOF

[75] Inventors: Yeh-Tseng Li; Chen-Kuei Chung; Jin-Shown Shie, all of Hsinchu, Taiwan

[73] Assignee: Industrial Technology Research Institute, Hsinchu, Taiwan

[21] Appl. No.: 08/909,089

[22] Filed: Aug. 12, 1997

[51] Int. Cl.[7] .............................. G02B 5/18; G02B 27/44; G03F 9/00; G03C 5/00

[52] U.S. Cl. ......................... 359/569; 359/566; 359/571; 359/575; 359/742; 430/5; 430/323

[58] Field of Search .................................. 359/565, 566, 359/569, 571, 572, 742, 575; 430/323, 325, 5

[56] References Cited

U.S. PATENT DOCUMENTS

| | | | |
|---|---|---|---|
| 4,846,552 | 7/1989 | Veldkamp et al. | 359/572 |
| 5,161,059 | 11/1992 | Swanson et al. | 359/565 |
| 5,402,435 | 3/1995 | Shiono et al. | 372/36 |
| 5,705,321 | 1/1998 | Brueck et al. | 430/323 |

*Primary Examiner*—Audrey Chang
*Attorney, Agent, or Firm*—Bacon & Thomas

[57] ABSTRACT

Method for the preparation of diffractive lens with one single etching step and using one single etching mask. While the widths and intervals of the masked areas of the photo masks are decided under a geometric relation, an etching mask can be prepared on the substrate of the lens where the widths and the intervals of the masked areas can be determined. As the included angle between the etching mask and the plan of the material of the lens is in a certain ratio to the etching efficiency of the etchant to the substrate of the lens, a one step etching process can be developed whereby multilevel diffractive lens with required number, widths and heights of the levels can be obtained. This invention also provides an oxidation-isotropic etching process on the diffractive lens so prepared.

6 Claims, 7 Drawing Sheets

DIFFRACTIVE LENS AND PREPARATION METHOD THEREOF

FIELD OF THE INVENTION

The present invention relates to a diffractive lens and a method for the preparation of the diffractive lens, especially to a method of preparing diffractive lens with one single mask under one single step.

BACKGROUND OF THE INVENTION

The diffractive lens is an important component in the micro-electromechanical systems and in the optical systems. The conventional diffractive lens has a so-called "terraced" diffractive structure which is prepared through etching or burning-off with laser beam, forming a multilevel structure on the substrate of the lens. Among the conventional approaches etching is frequently employed due to its low cost and convenience in operation.

In the conventional art, the diffractive lens is prepared under a multi-step etching process, by using a plurality of masks. FIGS. 1a to 1c show the steps of the conventional preparation of the terraced diffractive lens. FIG. 1a illustrates the structure of the first mask and the structure of the substrate after the first etching step. As shown in the figure, on the substrate 4, the area corresponding to the transparent area of the first mask 1 is developed and etched to form a two-step terrace structure. FIG. 1b illustrates the structure of the second mask and the structure of the substrate after the second etching step. As shown in the figure, on the substrate 4, the area corresponding to the transparent area of the second mask 2 is developed and etched to form a four-step terrace structure. FIG. 1c illustrates the structure of the third mask and the structure of the substrate after the third etching step. As shown in the figure, on the substrate 4, the area corresponding to the transparent area of the third mask 3 is developed and etched to form a eight-step terrace structure. By using the etching process as described above, it is possible to form a $2^n$-step terrace structure on the substrate 4 with n masks. When the material of the substrate is silicon or germanium, the etched substrate 4 can function as a diffractive lens for infrared.

In the conventional preparation of the diffractive lens, however, a plurality of masks and a series of etching (including developing) process are required. This does not only make the preparation of the diffractive lens time consuming and costly but that the problem of misalignment of the masks can not be avoided. For example, the distance between each stage of the terrace is approximately 2 $\mu$m. When any two of the masks are not aligned, the lens so prepared would be defected. This misalignment problem has become the major obstacle in enhancing the yield rate of the diffractive lens.

It is thus a need in the industry to have a diffractive lens that can be prepared under one-step etching process and with one single mask. It is also a need to provide a simplified method for the preparation of diffractive lens.

OBJECTIVES OF THE INVENTION

The purpose of the present invention is to provide a one-step preparation of diffractive lens that uses one single mask to prepare diffractive lens with multiple levels.

Another purpose of this invention is to provide a simplified preparation method for the diffractive lens.

SUMMARY OF THE INVENTION

According to the present invention, while the widths and intervals of the masked areas of the mask are decided under a geometric relation, an etching mask can be formed on the substrate of the lens where the widths and the intervals of the masked areas can be determined. As the included angle between the etching mask and the surface of the substrate of the lens is in a certain relation to the etching efficiency of the etchant to the substrate of the lens, a one-step etching process can be developed whereby multilevel diffractive lens with required levels, widths and heights of the terraces can be obtained.

This invention also provides an oxidation-isotropic etching process on the diffractive lens so prepared.

The above and other objectives and advantages of this invention can be clearly understood from the detailed specification by referring to the following drawings.

In the drawings,

FIG. 1(a) to (c) show the process of a conventional preparation of a diffractive lens wherein FIG. 1(a) shows the relation between the first mask and the lens as etched using the mask, FIG. 1(b) shows the relation between the second mask and the lens as etched using the mask and FIG. 1(c) shows the relation between the third mask and the lens as etched using the mask.

DETAILED DESCRIPTION OF THE INVENTION

The followings are detailed description to the method for preparation of diffractive lens of the present invention.

Figure 1:
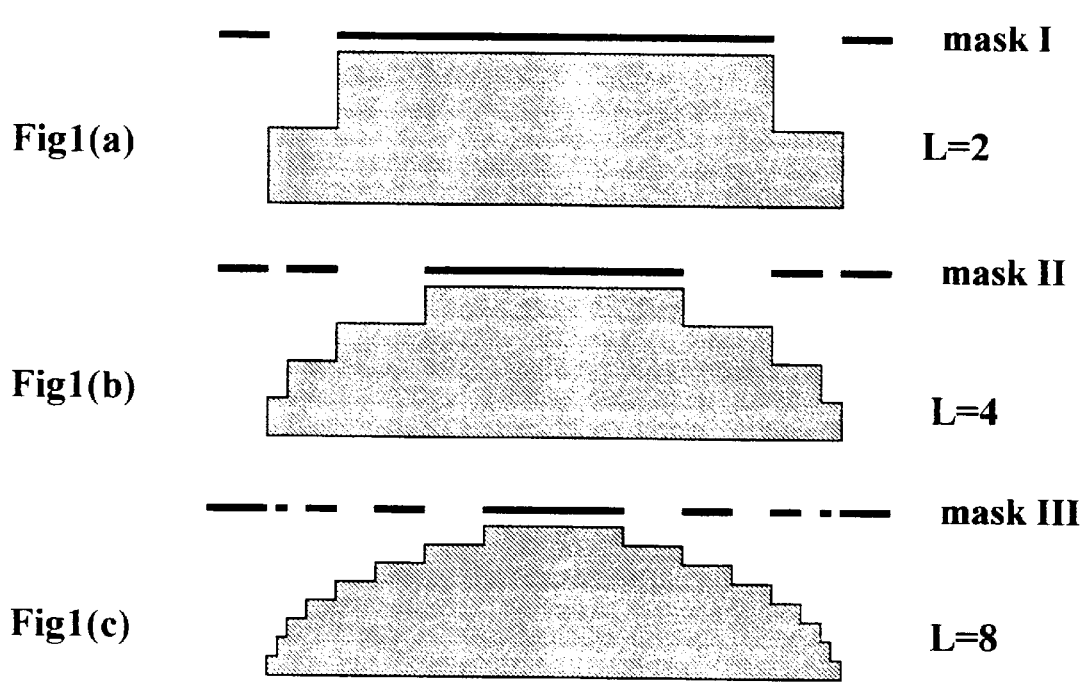
Figure 2:
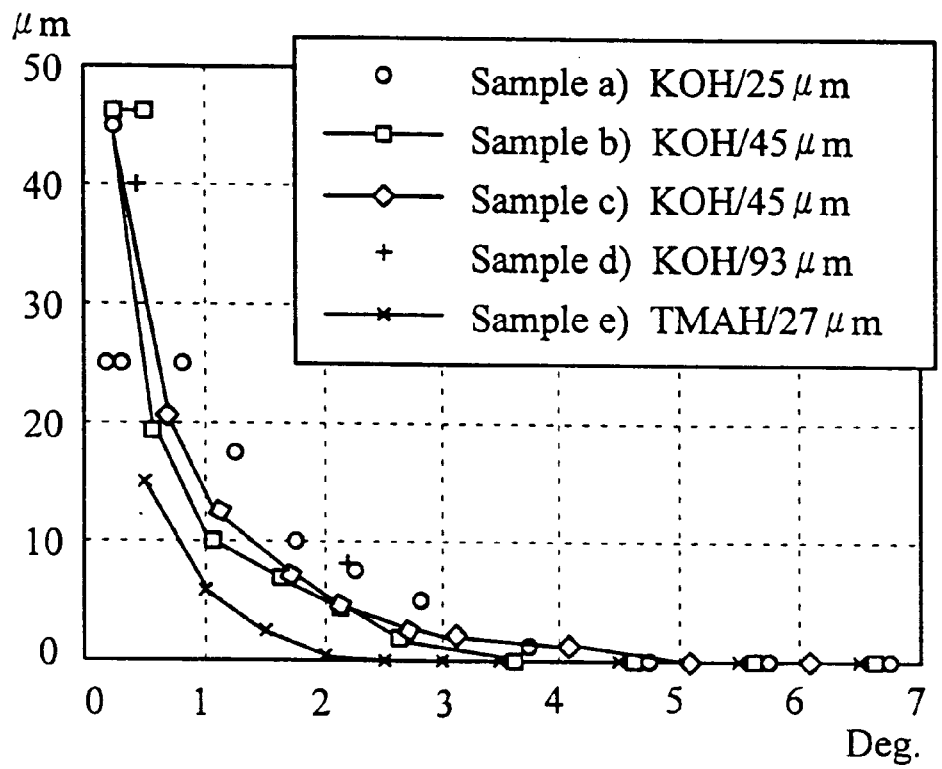
FIG. 2 illustrates the relation between the included angle between the etching mask and the surface of the lens and the terrace structure.

Although it is not intended to limit the scope of the present invention, it is found that the included angel between the etching mask and the surface of the lens material has certain influences on the terrace structure as etched. FIG. 2 shows the relation between the included angle of the etching mask and the surface of the lens material and the height of the terrace. Reference can be made to Mattias Vangbo and Yiva Backlund, "Terracing of (100)Si with One Mask and One Etching Step Using Misaligned V-Grooves", Journal of Micromechanics and Microengineering, Vol. 6, No. 1, March 1996, pp. 39. This finding can be of reference in this invention.

Figure 3:
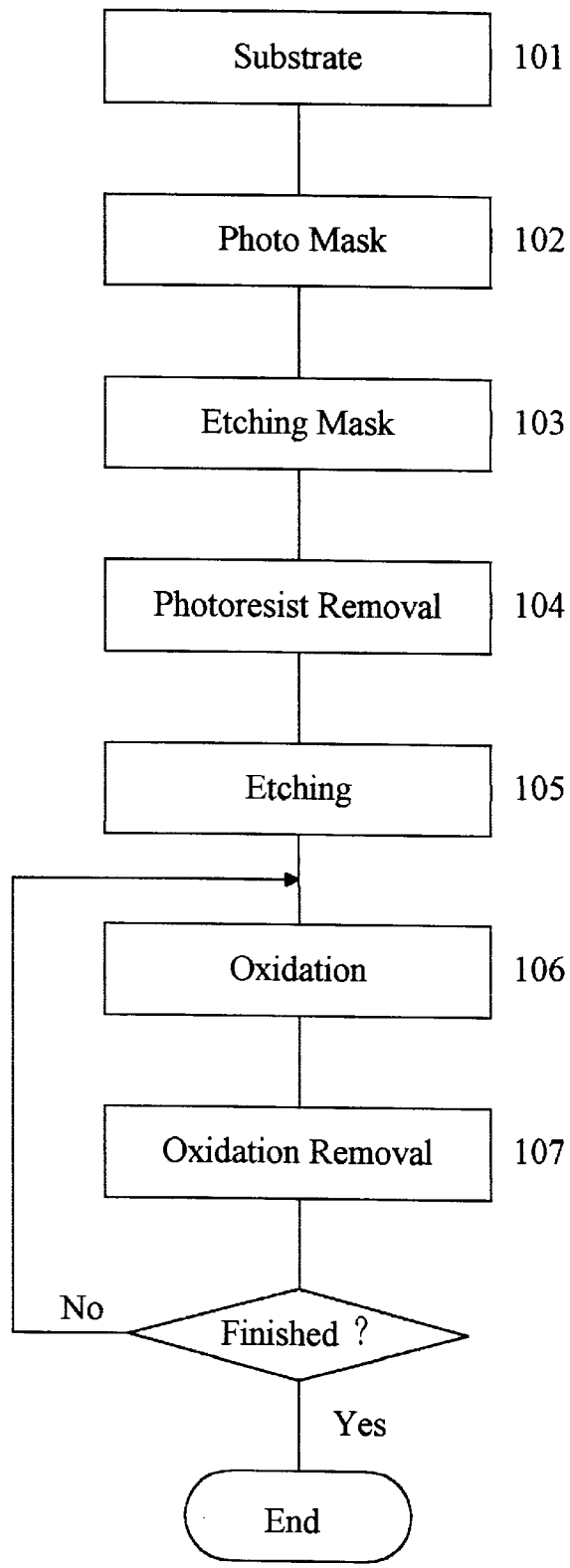
FIG. 3 shows the flow chart of the method for preparation of diffractive lens of this invention.
Figure 4:
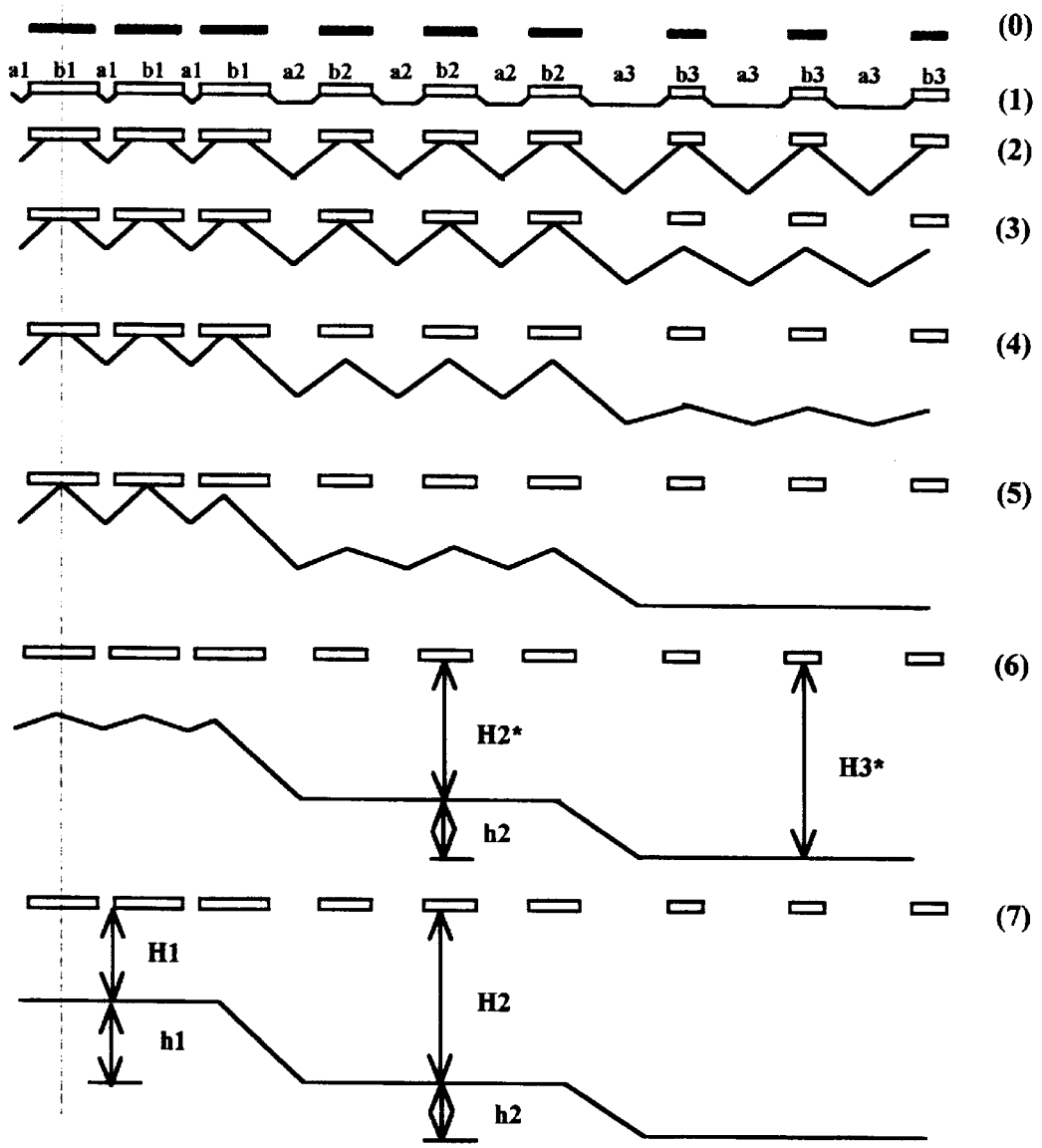
FIG. 4 shows the progresses of etching of the lens under the methods for preparation of diffractive lens of this invention.

FIG. 3 illustrates a flow chart of the method for preparation of the diffractive lens of this invention. FIG. 4 shows the progresses of etching of the lens under the method for preparation of diffractive lens of this invention. The following description will follow the sequence of FIG. 3 by referring to FIG. 4.

As shown in FIG. 3, at 101 a dice containing a lens is prepared according to the conventional art. The material of the lens may be silicon, germanium or other suited material. At 102 a mask is prepared. The pattern of the mask is designed to decide the heights and widths of the levels of the diffractive lens.

Figure 5:
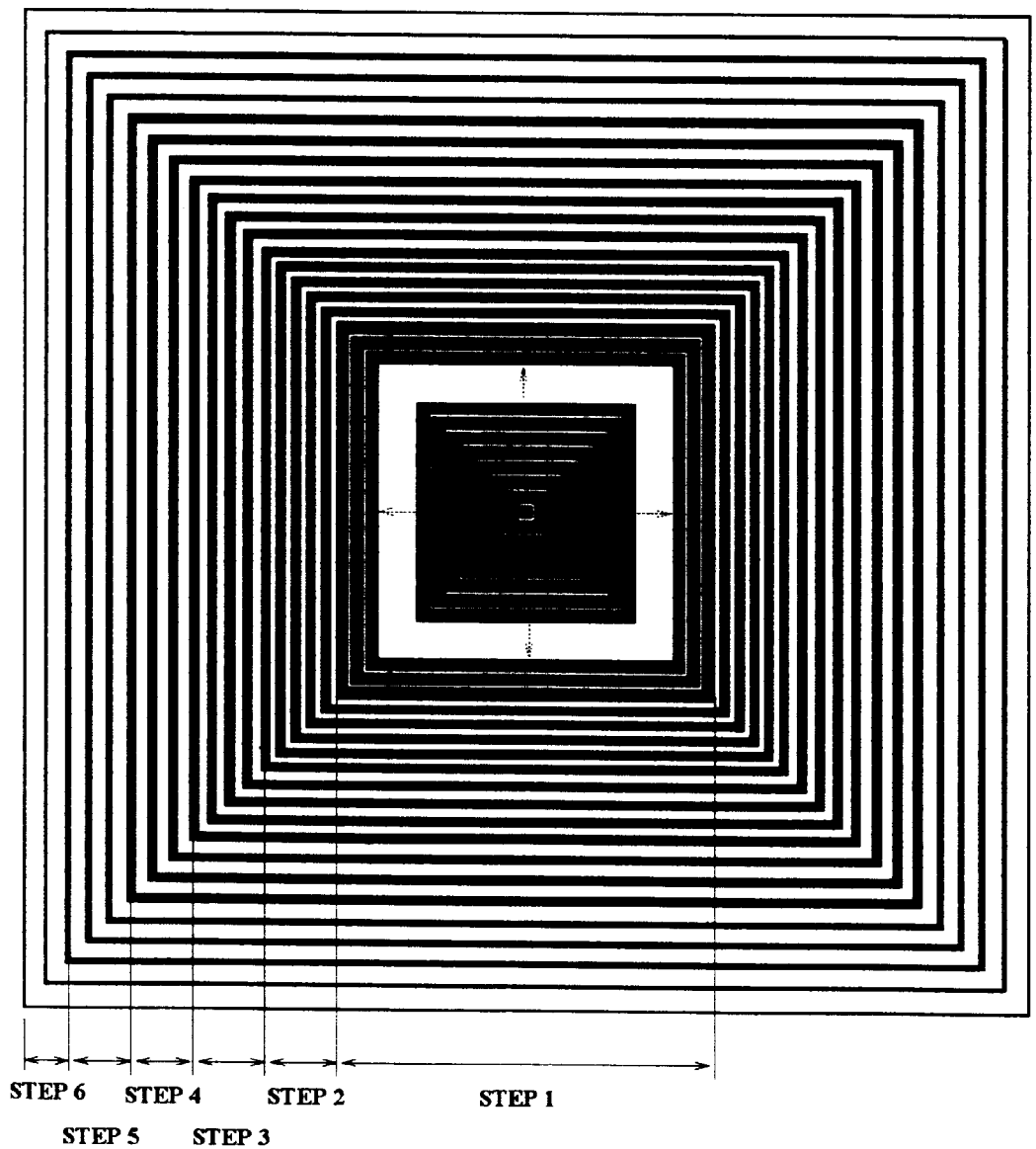
FIG. 5 illustrates a mask suited in the method of this invention.

FIG. 5 illustrates a mask suited in the present invention. As shown in this figure, the mask has a multi-homecentric pattern of the masked areas. Also as shown in the figure, the widths and intervals of the masked areas varies from level to level. In the masked areas labeled as "step 1", the width of and the interval between the masked areas are $b_1$ and $a_1$ respectively and the height of the lens so prepared in this step is $h_1$. In the masked areas labeled as "step 2", the width of and the interval between the masked areas are $b_2$ and $a_2$ respectively and the height of the lens so prepared in this step is $h_2$. And so on. The interval between the masked area of step 1 and that of step 2 is $b_2$, and so on. The premise of the diffractive lens is $h_1=h_2=h_3=\ldots=h$. From this condition we known that array $[a_n]$ and array $[b_n]$ have an arithmetic progression relation.

In the present invention, the intervals and widths of the masked areas in different steps formed arithmetic progressions:

1. Intervals: $a_n=a_1+(n-1)A$ wherein $a_1, a_2, \ldots, a_n$ represent the intervals between the masked areas; and
2. Widths: $b_n=b_1-(n-1)B$ wherein $b_1, b_2, b_3 \ldots, b_n$ represent the widths of the masked areas and n represents numbers of levels, n=1, 2, 3, 4, ...

In the above equations, $$A = \left(1 + \frac{3\sqrt{2}}{4}\Theta\right)\left[\frac{R_n - R_{n-1}}{(n-1)k} - \frac{a_1 + b_1}{n-1}\right] - h\Theta \text{ and}$$

$$B = \left\{\frac{3\sqrt{2}}{4}\left[\frac{R_n - R_{n-1}}{(n-1)k} - \frac{a_1 + b_1}{n-1}\right] - h\right\}\Theta \text{ wherein}$$

$$\Theta = \frac{1}{\frac{f_{100}}{2f_1} - \frac{3\sqrt{2}}{4}},$$

$f_{100}$ represents the etching efficiency of the (100) surface, $f_1$ is the etching efficiency in the side direction which is relative to the included angle of the etching mask and the surface of the dice; and $R_n - R_{n-1}$ is the least width of the terrace.

The following is a description to factors A and B:

1. From (7) of FIG. 4 we have:

$$H_1 = \frac{a_1 + b_1}{\sqrt{2}} + t_{pl} \times f \text{ wherein}$$

$$t_{pl} = \frac{(a_1 + b_1)/\sqrt{2}}{f_{100}}$$

and represents the time required in etching the substrate counting from when the b1 mask is uncovered to when the substrate becomes a plan and $f_{100}$ is the etching efficiency of the (100) surface; and $$f \equiv \frac{(f_{111}/\sqrt{3}) + f_{100}}{2} \approx \frac{f_{100}}{2}$$

is the mean etching efficiency from the under-cut to when the substrate becomes a plan, as shown in (5)–(7) in FIG. 4, and $f_{111}$ is the etching efficiency of the (111) surface.

We thus have:

$$H_1 \approx \frac{a_1 + b_1}{\sqrt{2}} + \frac{(a_1 + b_1)}{\sqrt{2} f_{100}} \times \frac{f_{100}}{2} = \frac{3a_1 + 3b_1}{2\sqrt{2}}.$$

2. Also from (7) in FIG. 4 we have:

$$h_1 = H_2 - H_1$$

$$H_2 = \frac{a_2 + b_2}{\sqrt{2}} + t_{p2} \times f + t_{p2} \times f_{100}$$

wherein $$t_{p2} = \frac{(a_2 + b_2)/\sqrt{2}}{f_{100}}$$

and represents the time required to etch the substrate under mask $b_2$ until it becomes a plan; wherein $t_{p2}$ represents the time counting from when the substrate becomes a plan in step 2 to when it becomes a plain in step 1 and $t_{p2}$ can be seen as the time difference between the etching of $b_1$ and the uncover of $b_2$. So that:

$$t_{p2} = \frac{(b_1 - b_2)/2}{f_1}.$$

In addition, $f_1$ is the etching efficiency in the side direction and is relative to the included angle of the mask and the surface of the dice.

We thus have:

$$H_2 = \frac{3a_2 + 3b_2}{2\sqrt{2}} + f_{100} \times \frac{(b_1 - b_2)/2}{f_1} \text{ and}$$

$$h_1 = H_2 - H_1 = \frac{3(a_2 - a_1) + 3(b_2 - b_1)}{2\sqrt{2}} + \frac{(b_1 - b_2)}{2} \frac{f_{100}}{f_1}.$$

3. From (6) of FIG. 4 we have:
$h_2=H_3-H_2$ wherein $$H_3 = \frac{a_3 + b_3}{\sqrt{2}} + t_{p3} \times f^* + t_{p3}^* \times f_{100}$$

$$h_2 = \frac{3(a_3 - a_2) + 3(b_3 - b_2)}{2\sqrt{2}} + \frac{b_2 - b_3}{2} \frac{f_{100}}{f_1}.$$

We then have:

$$H_1 = \frac{3a_1 + 3b_1}{2\sqrt{2}}$$

and is the distance between the surface of the dice and the surface of the first level after etching;

$$h_n = \frac{3(a_{n+1} - a_n) + 3(b_{n+1} - b_n)}{2\sqrt{2}} + \frac{b_n - b_{n+1}}{2} \frac{f_{100}}{f_1}$$

for n=1, 2, 3 ...

Because the heights of the level are the same in the Fresnel lens, so that $$h_1 = h_2 = \cdots = h_n = \frac{\lambda}{L(\mu - 1)}$$

This phenomenon can be used as the basis in designing the lens, as follows:

λ is the wave length of the infrared;

L is the total number of levels of the Fresnel lens;

μ is the fraction index of Si for infrared;

$$h = \frac{3A}{2\sqrt{2}} + \left(\frac{3}{2\sqrt{2}} - \frac{f_{100}}{2f_1}\right)B;$$

$a_n - a_{n-1} = a_{n-1} - a_{n-2} = A > 0$ or $a_n = a_1 + (n-1)A$; and $b_n - b_{n-1} = b_{n-1} - b_{n-2} = B < 0$ or $b_n = b_1 - (n-1)B$.

In consideration of the manufacture process, the factors shall be limited to a certain scopes:

(1) $a_1$: The least difference between the masked areas. In deciding he value of $a_1$, the limitation in the lithography process and the resolution in the etching process shall be taken for consideration.

Figure 7:
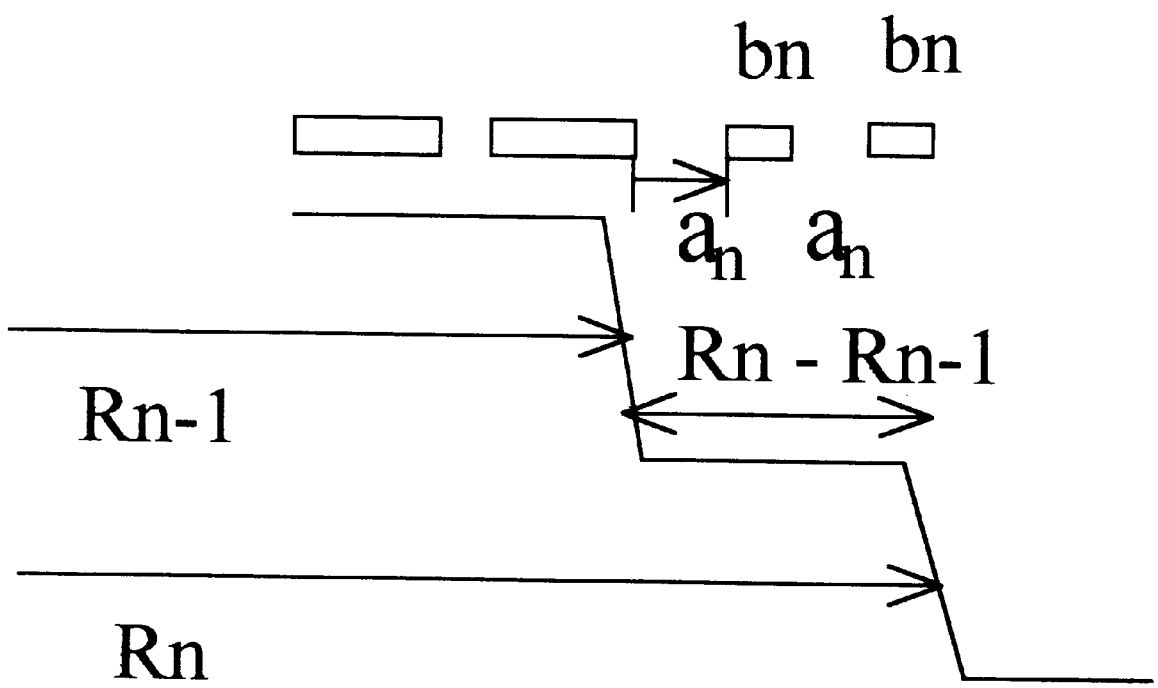
FIG. 7 illustrates the parameters applied in the specification of this invention.

(2) $a_n$: The largest difference between the masked areas. Its limitation is the condition that at the surface of the narrowest level where the width is $R_n - R_{n-1}$), the width shall be at least $2*b_n$, as shown in FIG. 7. That is, $$a_n = \frac{R_n - R_{n-1} - kb_n}{k},$$

k=1, 2, 3, . . . and is the largest number of masks that can be contained in the surface of the narrowest level.

Because:

$$a_n = a_1 + (n-1)A = \frac{R_n - R_{n-1} - kb_n}{k} \Rightarrow a_1 = \frac{R_n - R_{n-1} - kb_n}{k} - (n-1)A,$$

if $b_n = b_1 + (n-1)B$ is substituted into the above equation, we have:

$$A - B = \frac{R_n - R_{n-1} - (a_1 + b_1)k}{(n-1)k}.$$

The result is used to the resolution of the simultaneous equations with $$h = \frac{3A}{2\sqrt{2}} + \left(\frac{3}{2\sqrt{2}} - \frac{f_{100}}{2f_1}\right)B$$

and we have:

$$A = \left(1 + \frac{3\sqrt{2}}{4} \times \frac{\frac{3\sqrt{2}}{4}}{\frac{f_{100}}{2f_1} - \frac{3\sqrt{2}}{4}}\right)\left[\frac{R_n - R_{n-1}}{(n-1)k} - \frac{a_1 + b_1}{n-1}\right] - \frac{h}{\frac{f_{100}}{2f_1} - \frac{3\sqrt{2}}{4}} =$$

$$\left(1 + \frac{3\sqrt{2}}{4}\Theta\right)\left[\frac{R_n - R_{n-1}}{(n-1)k} - \frac{a_1 + b_1}{n-1}\right] - h\Theta$$

and $$B = \left\{\frac{3\sqrt{2}}{4}\left[\frac{R_n - R_{n-1}}{(n-1)k} - \frac{a_1 + b_1}{n-1}\right] - h\right\}\frac{1}{\frac{f_{100}}{2f_1} - \frac{3\sqrt{2}}{4}} =$$

$$\left\{\frac{3\sqrt{2}}{4}\left[\frac{R_n - R_{n-1}}{(n-1)k} - \frac{a_1 + b_1}{n-1}\right] - h\right\}\Theta$$

wherein $$\Theta = \frac{1}{\frac{f_{100}}{2f_1} - \frac{3\sqrt{2}}{4}}.$$

(3) K is the number of the masked areas in the narrowest level so that:

$$2 \le k \le Int\left[\frac{R_n - R_{n-1}}{\frac{(n-1)h\Theta}{1 + \frac{3\sqrt{2}}{4}\Theta} + a_1 + b_1}\right] = k_{max}$$

At 103 photoresist and material of the etching mask is applied to the substrate. Here the material of the etching mask may be $SiO_2$ or $Si_3N_4$ or other suitable material. The masks prepared in the preceding process are used to have the etching mask exposed and the patterns in the masks are transformed to the etching mask so prepared, using any suitable technology. At 104 the photoresist is removed and an etching mask is obtained. The substrate is then etched in an etchant at 105.

FIG. 4 shows the progresses of etching of the lens under the method for preparation of diffractive lens of this invention. In this figure, the mask is labeled as 0 and is used to show the relations between the pattern of the mask and the pattern of the etching mask. In same figure, 1 denotes the initial structure of the substrate. The substrate is etched gradually and in the stage labeled as 7, a three-leveled structure of the substrate is obtained. The relation between the heights of the levels and the applicable infrared is:

$$h = \frac{\lambda}{L(\mu - 1)},$$

is the height of each level;

$$R_{mj} = \sqrt{2\lambda f\left(m - 1 + \frac{l}{L}\right)},$$

is the radium of the first level in the $m^{th}$ wave band under an L-leveled structure; and $$m = ceil\left[\frac{L}{\lambda}\left(\sqrt{f^2 + \left(\frac{D}{2}\right)^2} - f\right)\right],$$

is the number of the wave bands;

wherein $\lambda$ is the wave length of the infrared, $\mu$ is the fraction index of Si for infrared and is 3.4, L is the total number of levels of the Fresnel lens which is relative to the first-order efficiency of the lens.

In the present invention, if KOH is used as the effective ingredient of the etchant, a KOH:water=50 g; 100 ml solution may be applied. The etching temperature may be 50–80° C. The relation between the etching depth and the width of the masked area of the mask in each step can be expressed as:

$$H_1 = \frac{a_1 + b_1}{\sqrt{2}} + t_{pI} \times f^n \text{ wherein}$$

$$t_{pI} = \frac{(a_1 + b_1)/\sqrt{2}}{f_{100}}$$

and is the time consumed in the etching counting from when mask $b_1$ is uncovered to when the substrate beneath the mask becomes a plan wherein $f_{100}$ is the etching efficiency of the (100) surface; and $$f^n \equiv \frac{(f_{111}/\sqrt{3}) + f_{100}}{2} \approx \frac{f_{100}}{2}$$

and is the average etching efficiency from the under-cut to when the substrate becomes a plan, as shown in (5)–(7) in FIG. 3, and wherein $f_{111}$ is the etching efficiency of the (111) surface.

After the etching process, a diffractive lens with high quality is obtained. In order to reduce the light scattering at the convex regions and to enhance the light condense effects, an oxidation-isotropic etching cycle may be optionally employed.

At 106 the whole surface of the lens is grown a heat oxidation layer. The thickness of the heat oxidation layer may be, for example, 500 Å. At 107 the oxidation level is removed with HF gas. Steps 106 and 107 may repeated for 2 to 3 times if necessary. A smooth curve surface may be formed on the lens.

Figure 6:
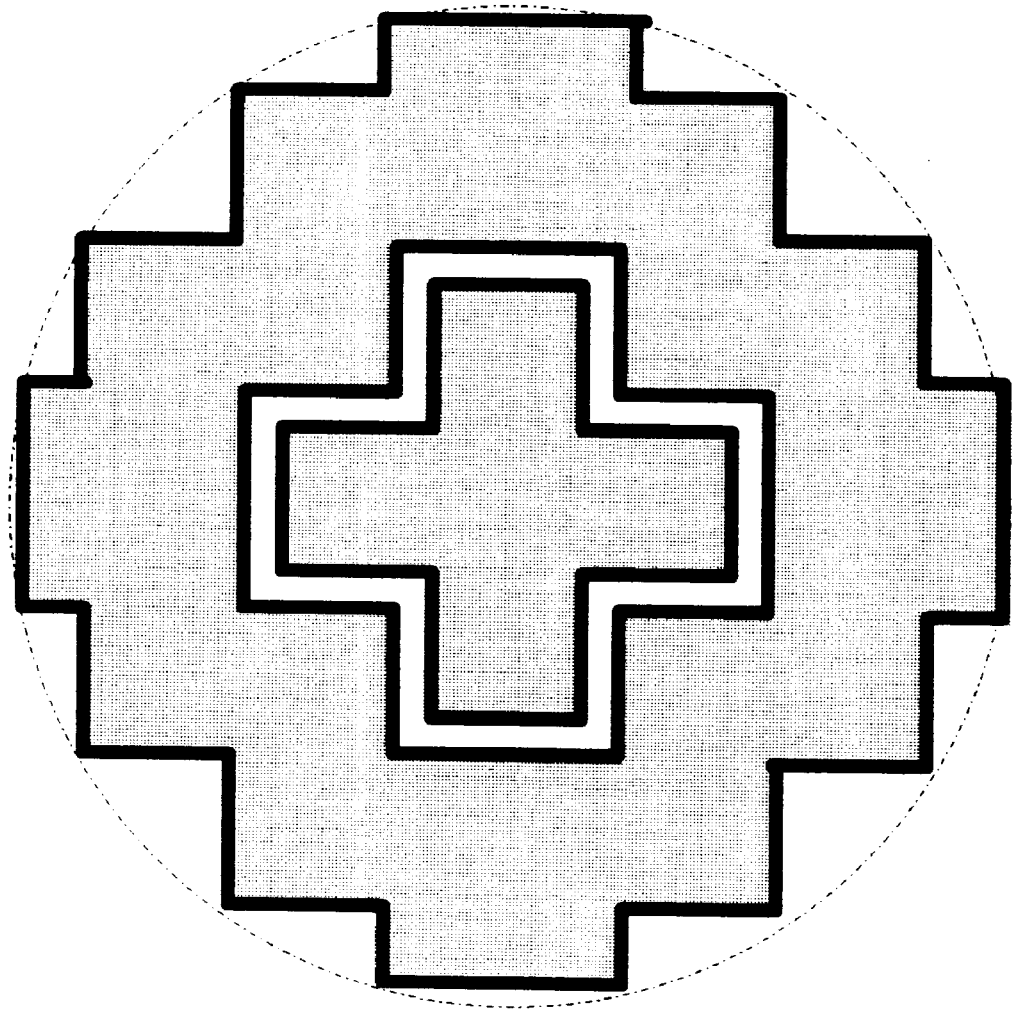
FIG. 6 illustrates another mask suited in the method of this invention.

The pattern of the mask as used in this invention may be a rectangular, multi-homecentric pattern, as shown in FIG. 5. If the corner-compensation effect is considered, the pattern shown in FIG. 6 can be used to prepare round-shaped lens.

EMBODIMENT

A diffractive lens is prepared according to the present invention where f=500 and D=200 (F number=2.5). The parameters of this embodiment are shown in the following Table.

| L | efficiency | m | h | $f_{100}/f_1$ | $a_1$ | $b_1$ | $R_n - R_{n-1}$ | k | A | B |
|---|---|---|---|---|---|---|---|---|---|---|
| 3 | 0.68 | 2 | 1.389 | 50 | 1 | 4 | 12.32191 | 3 | 0.184462 | −0.04773 |

The following factors are determined according to the above equations, as follows:

$$R_1 = R_{1,1} = \sqrt{2 \times 10 \times 500 \times \left(1 - 1 + \frac{1}{3}\right)} = 57.73;$$

$$R_2 = R_{1,2} = \sqrt{2 \times 10 \times 500 \times \left(1 - 1 + \frac{2}{3}\right)} = 81.65;$$

$$R_3 = R_{1,3} = \sqrt{2 \times 10 \times 500 \times \left(1 - 1 + \frac{3}{3}\right)} = 100;$$

$$R_4 = R_{2,1} = \sqrt{2 \times 10 \times 500 \times \left(2 - 1 + \frac{1}{3}\right)} = 115.47;$$

$$R_5 = R_{2,2} = \sqrt{2 \times 10 \times 500 \times \left(2 - 1 + \frac{2}{3}\right)} = 129.1;$$

$$R_6 = R_{2,3} = \sqrt{2 \times 10 \times 500 \times \left(2 - 1 + \frac{3}{3}\right)} = 141.42; \text{ and}$$

| $a_n = a_1 + (n - 1)A$ | $b_n = b_1 - (n - 1)B$ |
|---|---|
| a1 = 1 | b1 = 4 |
| a2 = 1.18 | b2 = 3.95 |
| a3 = 1.37 | b3 = 3.9 |
| a4 = 1.55 | b4 = 3.86 |
| a5 = 1.74 | b5 = 3.81 |
| a6 = 1.92 | b6 = 3.76 |

The masks are prepared accordingly. The patterns of the masks are transformed to the etching mask. The substrate (lens) is etched in a KOH:water=50 g; 100 ml solution for approximately 8–10 minutes. The structure of the lens is so obtained.

EFFECTS OF THE INVENTION

As shown in the above, the method for the preparation of diffractive lens inherent great advantages over the prior art. The diffractive lens may be prepared under one single etching step using one single etching mask. Under the present invention, not only preparation time is saved but also the problem of misalignment may be avoided.

The present invention may be used to prepare single infrared microlens, infrared microlens array, micro condenser array for infrared image sensors and other diffractive lens with microstructures.

As the present invention has been shown and described with reference to a preferred embodiment thereof, those skilled in the art will recognize that the above and other changes may be made therein without departing from the spirit and scope of the invention.

What is claimed is:

1. A lens assembly comprising a substrate containing at least a lens material and an etching mask having a multi-homocentric pattern of mask areas wherein said etching mask comprises a multi-homocentric pattern of masked areas wherein said masked areas are divided into steps, with masked areas belonging to a same step having the same width, the widths of said masked areas are $b_n$, the intervals between masked areas of a same step is $a_n$, n is the sequence of step and the interval between the masked areas in the $n^{th}$ step and in the $(n+1)^{th}$ step is $a_{n+1}$; wherein $a_n = a_1 + (n-1)A$ and $b_n = b_1 - (n-1)B$ wherein $$A = \left(1 + \frac{3\sqrt{2}}{4}\Theta\right)\left[\frac{R_n - R_{n-1}}{(n-1)k} - \frac{a_1 + b_1}{n-1}\right] - h\Theta \text{ and}$$

$$B = \left\{\frac{3\sqrt{2}}{4}\left[\frac{R_n - R_{n-1}}{(n-1)k} - \frac{a_1 + b_1}{n-1}\right] - h\right\}\Theta \text{ wherein}$$

h is the height of each level, $$\Theta = \frac{1}{\frac{f_{100}}{2f_1} - \frac{3\sqrt{2}}{4}}$$

and $f_{100}$ is the etching rate of the (100) surface of the substrate, $f_1$ is the etching rate in the lateral direction and $R_n - R_{n-1}$ is the width of the narrowest terrace; and k is the number of masked areas on the narrowest level wherein $$2 \leq k \leq Int\left[\frac{R_n - R_{n-1}}{\frac{(n-1)h\Theta}{1 + \frac{3\sqrt{2}}{4}\Theta} + a_1 + b_1}\right] = k_{max}.$$

2. The lens assembly according to claim 1 wherein said lens material is selected from the group consisting of silicon and germanium.

3. A method for the preparation of diffractive lens, comprising the following steps:
preparing a substrate comprising at least one lens material;
preparing one separate photo mask having a pattern thereon;
forming an etching mask layer on said substrate to form a lens assembly;
transferring the pattern on said photo mask to said etching mask layer; and
etching said lens assembly in an etchant to obtain a multilevel terrace structure; wherein said photo mask contains a multihomecentric pattern of masked areas wherein said masked areas are divided into steps, with masked areas belonging to a same step having the same width, the widths of said masked areas are $b_n$, the intervals between masked areas of a same step is $a_n$, n is the sequence of step and the interval between masked areas in the nth step and in the $(n+1)^{th}$ step is $a_{n+1}$, wherein $a_n = a_1 + (n-1)A$ and $b_n = b_1 - (n-1)B$ wherein $$A = \left(1 + \frac{3\sqrt{2}}{4}\Theta\right)\left[\frac{R_n - R_{n-1}}{(n-1)k} - \frac{a_1 + b_1}{n-1}\right] - h\Theta \text{ and}$$

$$B = \left\{\frac{3\sqrt{2}}{4}\left[\frac{R_n - R_{n-1}}{(n-1)k} - \frac{a_1 + b_1}{n-1}\right] - h\right\}\Theta \text{ wherein}$$

h is the height of each level, $$\Theta = \frac{1}{\frac{f_{100}}{2f_1} - \frac{3\sqrt{2}}{4}}$$

and $f_{100}$ is the etching rate of the (100) surface of the substrate, $f_a$ is the etching rate in the lateral direction and $R_n - R_{n-1}$ is the width of the narrowest terrace; and k is the number of masked areas on the narrowest level wherein $$2 \leq k \leq Int\left[\frac{R_n - R_{n-1}}{\frac{(n-1)h\Theta}{1 + \frac{3\sqrt{2}}{4}\Theta} + a_1 + b_1}\right] = k_{max}$$

4. The method according to claim 3 wherein said lens material is selected from the group consisting of silicon and germanium.

5. The method according to claim 3 wherein said etchant is selected from the group consisting of a solution of KOH in water, EDP, Hydrazine and TMAH.

6. The method according to claim 3, further comprising an oxidation-isotropic etching cycle, wherein said oxidation-isotropic etching cycle comprises:
growing a sacrificial oxidation layer on said lens assembly for about 500 Å;
removing said oxidation layer with HF gas; and
repeating the preceding processes until a smoothly curved surface is formed on the lens assembly.

* * * * *